United States Patent [19]
von Gentzkow et al.

[11] Patent Number: 5,760,146
[45] Date of Patent: Jun. 2, 1998

[54] P-MODIFIED EPOXY RESIN, PHENOLIC OH COMPOUND AND POLYAMINE

[75] Inventors: Wolfgang von Gentzkow, Kleinsendelbach; Jürgen Huber, Erlangen; Heinrich Kapitza, Fürth; Wolfgang Rogler, Möhrendorf, all of Germany

[73] Assignee: Siemens Aktiengesellschaft, Munich, Germany

[21] Appl. No.: 793,286

[22] PCT Filed: Aug. 25, 1995

[86] PCT No.: PCT/DE95/01135

§ 371 Date: Mar. 10, 1997

§ 102(e) Date: Mar. 10, 1997

[87] PCT Pub. No.: WO96/07684

PCT Pub. Date: Mar. 14, 1996

[30] Foreign Application Priority Data

Sep. 9, 1994 [DE] Germany ............... 44 32 187.2

[51] Int. Cl.$^6$ ............... B32B 17/04; B32B 27/04; C08L 63/02; C08L 63/04
[52] U.S. Cl. ............. 525/486; 428/297.4; 428/300.7; 428/301.1; 428/301.4; 428/901; 525/504; 525/523; 525/524
[58] Field of Search ............... 525/486, 504, 525/523, 524; 428/297.4, 300.7, 301.1, 301.4, 901

[56] References Cited

U.S. PATENT DOCUMENTS

| | | |
|---|---|---|
| 2,766,139 | 10/1956 | Green et al. . |
| 3,373,135 | 3/1968 | Jenker et al. . |
| 3,398,019 | 8/1968 | Langguth et al. . |
| 3,741,858 | 6/1973 | Fujiwara et al. ............ 161/185 |
| 4,111,909 | 9/1978 | Simons et al. ............ 528/123 |
| 4,783,345 | 11/1988 | Kleeburg et al. ............ 427/96 |
| 4,859,713 | 8/1989 | Blount ............ 521/106 |
| 5,095,050 | 3/1992 | Treybig et al. ............ 528/103 |
| 5,364,893 | 11/1994 | Von Gentzkow et al. ............ 523/429 |
| 5,376,453 | 12/1994 | Gentzkow et al. ............ 428/415 |
| 5,587,243 | 12/1996 | Von Gentzkow et al. ............ 528/103 |
| 5,624,979 | 4/1997 | Kleiner et al. ............ 528/104 |
| 5,648,171 | 7/1997 | Von Gentzkow et al. ............ 528/103 |

FOREIGN PATENT DOCUMENTS

| | | |
|---|---|---|
| 0 274 646 | 2/1992 | European Pat. Off. . |
| 0 384 940 | 6/1994 | European Pat. Off. . |
| 27 43 680 | 4/1979 | Germany . |
| 0 38 36 409 | 5/1990 | Germany . |
| 43 08 184 A1 | 9/1994 | Germany . |
| 43 08 185 A1 | 9/1994 | Germany . |
| 1-123892 | 5/1989 | Japan . |
| 2-124929 | 5/1990 | Japan . |
| 5-39345 | 2/1993 | Japan . |
| 1112139 | 5/1968 | United Kingdom . |

OTHER PUBLICATIONS

"Hanbook of Epoxy resins", McGraw Hill Book Company, 1967, pp. 10–19.

"Der IR–Lotprozebss aus der Sicht des Basismaterialherstellers", Von H. Schumacher, Galvanotechnik, D–88348 Saulgau, 84 (1993) 11, pp. 3865–3870.

"Flame Retardancy of Polymeric Materials", vol. 1, Marcel Dekker Inic., NY, 1973, pp. 24–38, 52–61.

"Modern Plastics", vol. 47 (1970), No. 6, pp. 140 ff.

Bonsignore et al., "A New Flane–Retardant Microfiber Reinforcement For Thermoplastics", Plastics Engineering, vol. 32, (1976), pp. 41 ff.

*Primary Examiner*—Robert E. Sellers
*Attorney, Agent, or Firm*—Kenyon & Kenyon

[57] ABSTRACT

Epoxy resin mixtures for prepregs and composites

Epoxy resin mixtures for preparing prepregs and composites contain the following components:

- a phosphorus-modified epoxy resin with an epoxy value of 0.02 to 1 mol/100 g, made up of structural units derived from
  (a) polyepoxy compounds with at least two epoxy groups per molecule and
  (b) phosphinic acid anhydrides, phosphonic acid anhydrides, or phosphonic acid half-esters;
- a glycidyl group-free compound with phenolic OH groups in the form of bisphenol-A, bisphenol-F, or a high-molecular phenoxy resin obtained through the condensation of bisphenol-A or bisphenol-F with epichlorohydrin;
- an aromatic polyamine used as a hardening agent.

15 Claims, No Drawings

P-MODIFIED EPOXY RESIN, PHENOLIC OH COMPOUND AND POLYAMINE

BACKGROUND OF THE INVENTION

The invention concerns epoxy resin mixtures for the production of prepregs and composites, as well as the prepregs and composites produced from these epoxy resin mixtures.

Composites based on epoxy resins and inorganic or organic reinforcing materials have become very important in many industrial fields and in everyday life. The reasons therefor are, on the one hand, the relatively simple and safe processing of epoxy resins and, on the other hand, the good mechanical and chemical properties of cured epoxy resin molded materials, which allow adaptation to different applications and advantageous utilization of the properties of all the materials which are part of the composite.

Epoxy resins are advantageously processed into composites via preparation of prepregs. For this purpose inorganic or organic reinforcing materials or embedding components in the form of fibers, non-woven and woven fabrics, or of flat shaped articles are impregnated with the resin. In most cases this is accomplished with a solution of the resin in an easy-to-evaporate or easy-to-volatilize solvent. The prepregs thus obtained must no longer be tacky, but must not yet be hardened after this process, but rather the resin matrix must be in a pre-polymerized state. In addition, the prepregs must have sufficiently long shelf life. Thus, for example, a shelf life of at least three months is required for circuit board manufacturing. When they are further processed into composites, prepregs must also melt on when the temperature is increased and must bond with the reinforcing materials or embedding components as well as with the materials provided for the composite as firmly and permanently as possible under pressure, i.e., the crosslinked epoxy resin matrix must have a high interfacial adhesion to the reinforcing materials, or embedding components, as well as to the materials to be bonded such as metals, ceramics, minerals, and organic materials.

In the cured state, composites are normally expected to have high mechanical strength and thermal stability, as well as chemical resistance, and heat distortion or resistance to aging. For electrotechnical and electronic applications, the requirements also include permanently high electrical insulation capability and, for special applications, a plurality of other requirements. For use as circuit board material, for example, high dimensional stability over a broad temperature range, good adhesion to glass and copper, high surface resistivity, low dielectric loss factor, good machinability (punchability, drillability), low water absorption, and high corrosion resistance are required.

With increasing load and intensive use of the composites, in particular the requirement for heat distortion becomes especially important. This means that the materials must resist high temperatures without deformation or damage of the composite, for example by delamination, during processing and use. Circuit boards, for example, are exposed to temperatures of over 270° C. during flow soldering. Temperatures over 200° C. may also occur temporarily and in a limited area during cutting and drilling. Materials with a high glass transition temperature have advantageous characteristics in this respect. If the glass transition temperature is above the aforementioned values, dimensional stability in the temperature range prevailing during processing is generally ensured and damage such as warping and delamination are mostly avoided. The epoxy resin currently used worldwide for FR4 laminates has a glass transition temperature $T_g$ of only 130° C. after curing. This results, however, in the above-mentioned type of damage and failure during manufacturing. Therefore it has for long been desired to have comparatively easy-to-process and inexpensive materials with a glass transition temperature $T_g$ of over approx. 180° C.

Another requirement that is becoming more and more important is that of flame resistance. In many areas this requirement has first priority due to possible hazards to people and property, for example, in construction materials for aircraft and automobile manufacturing, as well as for vehicles in public transportation. Flame resistance of circuit board materials is essential in electrotechnical, but especially electronic, applications due to the high value of the electronic components mounted on the boards.

Therefore materials must pass one of the strictest tests and attain V-0 classification by UL 94 V, for evaluating their flammability. In this test, a test object is exposed to a well-defined flame positioned vertically under its lower edge. The sum of burning times in ten tests may not exceed 50 s. This requirement is difficult to meet, especially if the material is thin, as is the case in electronics. The epoxy resin industrially used worldwide for FR4 laminates only meets these requirements because it contains approximately 30% to 40% ring-brominated aromatic epoxy components, with reference to the resin, i.e., approximately 17%–21% bromine. For other applications, comparably high concentrations of halogen compounds are used, often also combined with antimony trioxide as a synergist. The problem with these compounds is that, while they are highly effective as fireproofing agents, they also have very objectionable properties. Thus, antimony trioxide is listed as a carcinogenic chemical, and aromatic bromine compounds, during thermal decomposition, not only split off bromine radicals and hydrogen bromide, which are highly corrosive, but, especially the highly brominated aromatic compounds may also form highly toxic polybromine benzofurans and polybromine benzodioxins upon decomposition in the presence of oxygen. The disposal of bromine-containing waste materials and toxic waste represents another problem.

Materials that partially or fully meet the heat distortion requirement include, for example, bismaleinimide/triazine (BT) -based molded materials with a $T_G$, of approximately 200° C. or polyimide (PI) with a $T_G$ of 260° to 270° C. Recently also BT/epoxy blends with a $T_G$ of 180° C.,as well as cyanate ester resins with a $T_G$>200° C., have also become available. Laminates manufactured with these resin systems exhibit, however, poorer processing and machining characteristics compared to epoxy resin-based laminates. Thus, for example, the production of PI-based laminates requires press temperatures of approximately 230° C. and considerably longer after-curing times (approx. 8 h) at temperatures of 230° C. Another disadvantage of these resin systems is their six to ten times higher material costs.

A comparatively inexpensive resin system is obtained if aromatic and/or heterocyclic polyepoxy resins, i.e., polyglycidyl compounds, are combined with aromatic polyamines acting as hardening agents. Such polyamines known, for example, from German Patent 2,743,680, result in network polymers that exhibit a particularly high heat distortion and resistance to aging. European Patent 274,646 discloses that, using 1, 3,5-tris (3-amino-4-alkylphenyl)-2,4,6-trioxohexahydrotriazines as hardening agents, laminates with a glass transition temperature of up to 245° C. and good processing and machining characteristics can be obtained.

Although the above-mentioned resin systems have a widely different flammability, they all share the disadvantage of being insufficiently flame-retardant. Therefore, in order to meet the requirement of passing the UL 94 V combustibility test with a V-0 classification, which is essential for many applications, the use of highly effective bromine-containing fireproofing agents cannot be avoided. As a result, both the potential hazard associated with bromine compounds and the impaired thermal-mechanical characteristics caused by the bromine compounds must be taken into account.

For these reasons, extensive research has been conducted to replace bromine-containing fireproofing agents with less problematical substances. Thus, for example, fillers (with extinguishing gas effects such as aluminum oxide hydrates (see *J. Fire and Flammability*, Vol. 3 (1972), pp. 51 ff.), basic aluminum carbonates (see *Plast. Engng.*, Vol. 32 (1976), pp. 41 ff.) and magnesium hydroxides (European Offenlegungsschrift 243,201, as well as vitrifying fillers such as borates (see *Modern Plastics*, Vol. 47 (1970), No. 6, pp. 140 ff) and phosphates (U.S. Pat. No. 2,766,139 and U.S. Pat. No. 3,398,019) have been proposed. All these fillers have, however, the disadvantage of worsening, in some cases considerably, the mechanical, chemical, and electrical properties of the composites. In addition, they require special, more complicated processing methods, since they tend to sedimentation and increase the viscosity of the filled resin system.

The flame-retardant properties of red phosphorus has also been described (U.K. Patent 1,112,139), optionally in combination with finely dispersed silicon dioxide or aluminum oxide hydrate (U.S. Pat. No. 3,373,135). According to these documents, materials are obtained whose use in electrotechnical and electronic applications is limited due to the phosphoric acid produced in the presence of moisture and the associated corrosion. Organic phosphorus compounds, such as phosphoric acid esters, phosphonic acid esters, and phosphines, have also been proposed as flame-retardant additives (see W. C. Kuryla and A. J. Papa *Flame Retardance of Polymeric Materials*, Vol. 1, Marcel Dekker Inc., New York, 1973, pp. 24–38 and 52–61). Since these compounds are known for their "softening" characteristics and are therefore extensively used worldwide as plasticizers for polymers (U.K. Patent 10,794), this alternative is therefore also not very promising.

In order to achieve flame-resistance according to UL 94 V-0, German Offenlegungsschrift 3,836,409 discloses a method for preparing prepregs by impregnating certain reinforcing materials or flat shaped articles with a suspension of halogen-free, nitrogen- and phosphorus-containing fireproofing agents in a solution of aromatic, heterocyclic, and/or cycloaliphatic epoxy resins (in a non-ring-halogenated form or a ring-halogenated form with low halogen content) and aromatic polyamines and/or aliphatic amines acting as hardening agents. The fireproofing agents are halogen-free melamine resins or organic phosphoric acid esters, particularly melamine cyanurates, melamine phosphates, triphenyl phosphate, and diphenylcresyl phosphate, as well as their mixtures. This, however, is also not a very promising solution, since the fillers used always increase water absorption, and therefore prevent the material from passing the circuit board-specific tests.

Organic phosphorus compounds, such as epoxy group-containing phosphorus compounds, which can be anchored in the epoxy resin network, can also be used for providing epoxy resins with flame-retarding characteristics. Thus, European Patent 384,940 discloses epoxy resin mixtures containing a commercially available epoxy resin, the aromatic polyamine 1,3,5-tris(3-amino-4-alkylphenyl)-2,4,6-trioxo-hexahydrotri azine and an epoxy group-containing, glycidyl phosphate-, glycidyl phosphonate- or glycidyl phosphinate-based phosphorus compound. With such epoxy resin mixtures, flame-retardant laminates or composites that meet the V-0 classification requirements of UL 94 and have a glass transition temperature >200° C., can be obtained without adding halogens. Furthermore, these epoxy resin mixtures can be processed in a manner similar to that used for currently used epoxy resins.

Circuit boards constitute the basis for the production of electronic assemblies. They are used for connecting a variety of electronic and microelectronic components with one another to form electronic circuits. The components are connected to the circuit board by gluing or soldering using complex, highly automated assembly processes. Also in automatic insertion, there is a trend toward more streamlined manufacturing methods. Therefore IR reflow soldering, expected to replace other soldering processes in the future, is increasingly used in SMD technology. In this process, the entire circuit board is heated to temperatures >260° C. in a few seconds using IR radiation; this instantly evaporates any water absorbed in the circuit board. Only laminates with excellent interlaminar adhesion survive IR soldering processes without being destroyed by delamination. In order to reduce this hazard, expensive conditioning processes have been proposed (see *Galvanotechnik*, Vol. 84 (1993), pp. 3865–3870).

It is known that in laminates with high glass transition temperature, for example, based on PI- or BT-resins, the interlaminar adhesion is weaker than in the halogen-containing FR4 laminates that are being predominantly used today; this is also true for the laminates known from European Patent 384,940. Most of the circuit boards manufactured today are multilayer (ML) circuit boards, which contain a plurality of structured conductor planes spaced and insulated from one another by epoxy resin compounds. The current trend in ML technology, however, is toward an increasing number of structured conductor planes; thus, currently multilayer circuit boards with more than 20 structured conductor planes are being manufactured. Since excessive overall thickness of these circuit boards must be avoided for technical reasons, the distance between the structured conductor planes is becoming increasingly smaller and thus interlaminar adhesion and copper adhesion in ML laminates with high glass transition temperature is becoming more and more problematic. In addition, this type of circuit board must have a high solder bath resistance in the case of IR soldering.

As stated earlier, it is known from European Patent 384,940 that laminates with a flame resistance meeting the requirements can be obtained without using halogens through phosphorus modification of impregnation resins. It was found, however, during production research, that phosphorus-modified laminates are subject to delamination during IR soldering. Therefore, urgent need has arisen for electrolaminates having the required flame resistance without the use of halogens, for example through incorporating phosphorus into the resin matrix, but which are also suitable for IR soldering required for SMD technology. This requires electrolaminates with extremely high solder bath resistance. In circuit board technology, the high-pressure cooker test (HPCT) and the determination of solder bath resistance are primarily used to test the suitability of laminates for high thermal stressing. In HPCT, a laminate specimen (5×5 cm), freed of copper, is exposed to 120° C. and approximately 1.4 bar steam pressure for 2 h and then placed to float on a 260° C. hot solder bath. The time to delamination is then measured. Qualitatively good laminates exhibit no delamination up to >20 s. Solder bath resistance is determined on 2×10 cm large laminate specimens by dipping them into a 288° C. hot solder bath and measuring the time to delamination.

SUMMARY OF THE INVENTION

The object of the invention is to provide epoxy resin mixtures that can be obtained in a simple and therefore inexpensive manner and are easy to process compared to epoxy resins currently used in industry, are suitable for the production of prepregs and laminates for multilayer technology, can be made into molded materials with as high a glass transition temperature as possible ($\geqq 180°$ C.) and are highly flame-retardant, meeting the requirements of UL 94 for V-0 classification, without the addition of halogens, and have at the same time a solder bath resistance that is sufficiently high so that IR soldering processes can be used for electronic assembly manufacturing without delamination.

DETAILED DESCRIPTION OF THE INVENTION

This object is achieved according to the invention through epoxy resin mixtures containing the following components:

a phosphorus-modified epoxy resin with an epoxy value of 0.02 to 1 mol/100 g, made up of structural units derived from (a) polyepoxy compounds with at least two epoxy groups per molecule and (b) phosphinic acid anhydrides, phosphonic acid anhydrides, or phosphonic acid half-esters;

a glycidyl group-free compound with phenolic OH groups in the form of bisphenol-A, bisphenol-F, or a high-molecular phenoxy resin obtained through the condensation of bisphenol-A or bisphenol-F with epichlorohydrin;

an aromatic polyamine with the following structure used as a hardening agent:

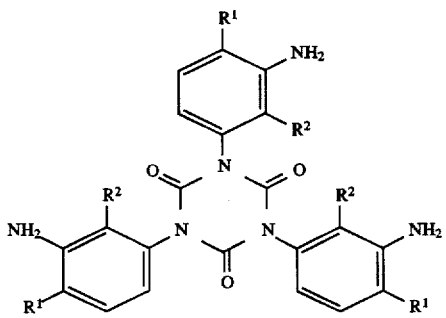

where one of the radicals $R^1$ and $R^2$ on each aromatic partial structure denotes a H atom and the other one denotes an alkyl group.

The phosphorus-modified epoxy resins contained in the epoxy resin mixtures according to the invention are obtained by reacting commercially available polyepoxy resins (polyglycidyl resins) with the following phosphorus compounds:

phosphinic acid anhydrides: anhydrides of phosphinic acids with alkyl, alkenyl, cycloalkyl, aryl, or aralkyl radicals; these may include: dimethylphosphinic acid anhydride, methylethylphosphinic acid anhydride, diethylphosphinic acid anhydride, dipropylphosphinic acid anhydride, ethylphenylphosphinic acid anhydride, and diphenylphosphinic acid anhydride;

bisphosphinic acid anhydrides: anhydrides of bisphosphinic acids, particularly of alkane-bisphosphinic acids with 1 to 10 carbon atoms in the alkane group;

examples therefor include: methane-1,1-bis-methylphosphinic acid anhydride, ethane-1,2-bismethylphosphinic acid anhydride, ethane-1-2-bisphenylphosphinic acid anhydride and butane-1,4-bismethylphosphinic acid anhydride;

phosphonic acid anhydrides: anhydrides of phosphonic acids with alkyl, alkenyl, cycloalkyl, aryl, or aralkyl radicals; these may include: methanephosphonic acid anhydride, ethanephosphonic acid anhydride, propanephosphonic acid anhydride, hexanephosphonic acid anhydride, and benzenephosphonic acid anhydride;

phosphonic acid half-esters: those preferably used include half-esters, i.e., monoesters of phosphonic acids with alkyl radicals (preferably with 1 to 6 carbon atoms) or with aryl radicals (in particular benzenephosphonic acid) with aliphatic alcohols, in particular low-boiling aliphatic alcohols such as methanol and ethanol;

examples include: methanephosphonic acid monomethyl ester, propanephosphonic acid monoethyl ester, and benzenephosphonic acid monomethyl ester;

phosphonic acid half-esters can be obtained by partial hydrolysis of the corresponding phosphonic acid diesters, in particular using sodium hydroxide solution or by partial esterification of free phosphonic acids with the corresponding alcohol. The preparation of phosphorus-modified epoxy resins of the above-mentioned types is also described in the German Offenlegungsschriften 4,308,184 and 4,308,185.

In general both aliphatic and aromatic glycidyl compounds, as well as their mixtures, can be used to obtain phosphorus-modified epoxy resins. Preferably bisphenol-A-diglycidyl ether, bisphenol-F-diglycidyl ether, polyglycidyl ethers of phenol-formaldehyde and cresol-formaldehyde novolaks, diglycidyl esters of phthalic, isophthalic, terephthalic, and tetrahydrophthalic acid, as well as mixtures of these epoxy resins, are used. Other polyepoxides are described in *Handbook of Epoxy Resins* by Henry Lee and Kris Neville, McGraw-Hill Book Company 1967 and in the monograph by Henry Lee *Epoxy Resins, American Chemical Society* 1970.

Among the possible phosphorus-modified epoxy resins, phosphonic acid-modified epoxy resins, such as methyl, ethyl, and propylphosphonic acid-modified epoxy resins have been found to be particularly advantageous, in particular with a phosphorus content of 2 to 5 wt. %, for the production of solder-bath-resistant electrolaminates. Furthermore, phosphorus-modified epoxy resins with an average of at least one epoxy function, in particular those with an average of at least two epoxy functions, have been found advantageous. Such phosphorus-modified epoxy resins can be prepared by reacting epoxy novolak resins having a functionality of approximately 3 to 4 with phosphonic acid anhydrides. The phosphorus-modified epoxy resins contain 0.5 to 13 wt. % phosphorus, preferably 1 to 8 wt. %. The overall phosphorus content of the epoxy resin mixtures, i.e., the impregnation resin mixtures, is 0.5 to 5 wt. %, preferably 1 to 4 wt. %.

The epoxy resin mixtures according to the invention contain a glycidyl group-free compound with phenolic OH groups. This compound is added to achieve specific characteristics. Bisphenol-A and bisphenol-F, as well as phenoxy resins serve this purpose. These are linear condensation products of bisphenol-A and bisphenol-F with epichlorohydrin in the form of high-molecular compounds with a molecular weight of up to 30,000; the end-position phenolic OH function content is very small, much less than 1%. The preparation method and properties of such phenoxy resins are known (see *Encyclopedia of Polymer Science and Engineering* (second edition), Vol. 6, pp. 331 and 332, John Wiley & Sons, Inc., 1986). The compound with phenolic OH groups is added in the amount of 0 to 20 wt. %, preferably from 0 to 10 wt. %, to the epoxy resin mixtures according to the invention. It must be taken into account that the glycidyl group-free phenolic component can only be added in a proportion where the flame-resistance requirement of UL 94 V specification is still met.

The aromatic polyamines that serve as hardening agents in the epoxy resin mixtures according to the invention are well-known. Polyamines with the above-mentioned structure with $R^1$=alkyl and $R^2$=H are described in European Patent 274,646.

They are prepared by trimerization of 2,4-diisocyanatoalkylbenzenes and subsequent hydrolysis of the remaining isocyanate groups. Compounds with $R^1$=H and $R^2$=alkyl are obtained similarly by trimerization of 2,6-diisocyanatoalkylbenzenes and subsequent hydrolysis. Both polyamines of the two aforementioned types and mixtures of these compounds can be used as hardening agents in the epoxy resin mixtures according to the invention. In addition, polyamines obtained by trimerization of mixtures of 2,4-and 2,6-diisocyanate\0-alkylbenzenes and subsequent hydrolysis of the trimerizate can also be used. Such mixtures are available in bulk quantities and allow the hardening agent component to be manufactured inexpensively. The hardening agent content in the resin mixture is advantageously 1 to 45 wt. %, preferably 5 to 30 wt. %.

A reaction between isocyanate groups and amino groups may also occur during the hydrolysis of the isocyanate group-containing trimerization products. This results in heterocyclic polyamines with urea groupings as a byproduct of the hydrolysis. Such polyamines can also be used in the epoxy resin mixtures according to the invention as additive hardening components together with the actual hardening agent. In addition to the actual hardening agent or hardening mixture of the above-mentioned type, aromatic polyamines of another type, such as 4,4'-diaminodiphenylmethane and 4,4'-diaminodiphenylsulphone, and/or other heterocyclic polyamines can be used. The content of such polyamines in the hardening mixture is generally 30 wt. % maximum.

The equivalent ratio between the epoxy function and amine hydrogen function can be 1:0.5 to 1:1.1, and is preferably 1:0.7 to 1:0.9.

The epoxy resin mixtures according to the invention can also contain accelerators which, as is known, play an important role in the curing of epoxy resins. Normally tertiary amines or imidazoles are used. Appropriate amines include, for example, tetramethylethylenediamine, dimethyloctylamine, dimethylaminoethanol, dimethylbenzylamine, 2,4,6 -tris (dimethylaminomethyl )-phenol, N,N'-tetramethyldiaminodiphenylmethane, N,N'-dimethylpiperazine, N-methylmorpholine, N-methylpiperidine, N-ethylpyrrolidine, 1,4-diazobicyclo (2,2,2)-octane, and chinolines. Appropriate imidazoles include, for example, 1-methylimidazole, 2-methylimidazole, 1,2-dimethylimidazole, 1,2,4,5-tetramethylimidazole, 2-ethyl-4-methylimidazole, 1-cyanoethyl-2-phenylimidazole, and 1-(4,6-diamino-s-triazinyl-2-ethyl)-2-phenylimidazole. The accelerator is used in a concentration of 0.01 to 2 wt. %, preferably 0.05 to 1 wt. %, always referred to the epoxy resin mixture.

The different components are dissolved separately or together in inexpensive solvents, such as acetone, methylethylketone, ethyl acetate, methoxyethanol, dimethylformamide, and toluene, or in mixtures of such solvents to prepare prepregs, the solutions can be combined in a single solution. The solution is then processed on conventional impregnation systems, i.e., systems for soaking inorganic or organic materials such as glass, metal, minerals, carbon, aramide, polyphenylene sulfide, and cellulose, as well as woven or non-woven fabrics made of such materials, or used for coating flat shaped articles such as metallic or plastic films. The impregnation solutions may also contain other halogen-free substances to improve the flame-resistance, which may be applied in a homogenous solution or as a dispersed system. Such additives can include, for example, melamine cyanurates, melamine phosphates, pulverized polyetherimide, polyethersulfone, and polyimide.

Glass fiber fabrics are predominantly used for the manufacture of prepregs for circuit board technology. In particular prepregs made of glass fiber fabric types with a surface density of 25 to 200 g/m² are used for multilayer circuit boards. With impregnation solutions of the aforementioned type, prepregs with low surface densities can also be produced as needed. The impregnated or coated reinforcing materials or embedding components are dried at a high temperature, which removes the solvent and causes prepolymerization of the impregnation resin. Overall, an extraordinarily favorable cost-to-feature ratio can be obtained in this manner.

The coatings and prepregs obtained are non-tacky and have a shelf-life of three months or longer at room temperatures, i.e., have sufficient shelf life. They can be pressed at temperatures up to 220° C. to form composites, which have high glass transition temperatures ($\geq 180°$ C.) and inherent flame-resistance. If glass fiber fabrics in a proportion of 60 to 62 wt. % referred to the laminate are used as the embedding material, the burning test according to UL 94 V can be safely passed with a V-0 classification without adding halogen compounds or other flame-retardant additives, even with test specimens with wall thicknesses as low as 1.6 or even 0.8 mm. It is especially advantageous that no corrosive or particularly toxic cleavage products are formed and smoke development is considerably less than for other polymeric materials, particularly bromine-containing epoxy resin molded materials.

The cured composites are also distinguished by their small thermal expansion coefficients that remain constant over a broad temperature range and high chemical resistance, corrosion resistance, low water absorption, and excellent electrical properties. Adhesion to the reinforcing and bonding materials is outstanding. When using reinforcing materials of the above-mentioned type, prepregs for construction materials supporting high mechanical stresses are obtained. These construction materials are suitable, for example, for applications in machine construction, vehicle manufacturing, aerospace industry, and electrical engineering, in particular in the form of prepregs for circuit board manufacturing, specifically for manufacturing multilayer circuits.

Especially advantageous for use as circuit board material is the high adhesion strength of copper circuit paths, as well as the high delamination resistance. Using the epoxy resin mixtures according to the invention, materials, in particular multilayer circuit boards, are manufactured, where thin cores of less than/equal to 100 µm having sufficient solder bath resistance even for IR soldering processes are used.

The invention is further explained using the embodiments (MT=parts by weight).

Examples 1 through 3

Manufacturing of prepregs

A solution of A MT of a phosphorus-modified epoxy resin (P/EP resin) in the form of a reaction product (epoxy value:

0.35 mol/100 g; phosphorus content: 3.4%) of an epoxidized novolak (epoxy value: 0.56 mol/100 g; average functionality: 3.6) and propanephosphonic acid anhydride in E MT methyl-ethyl ketone (MEK), F MT dimethylformamide (DMF) and G MT ethyl acetate (EA) is mixed with B MT of a polyamine obtained by trimerization of a 4:1 mixture of toluene-2,4-diisocyanate and toluene-2-6-diisocyanate and subsequent hydrolysis (to a product with an $NH_2$ value of 9.35%), C MT of a phenoxy resin with a molecular weight of 30,000 and a hydroxy value of 6% (phenol resin), and D MT 2-methyl-imidazole (MeIm). With the resin solution thus obtained, glass fiber fabric specimens (fabric type 7628, surface density 197 g/m²) were continuously impregnated using a laboratory impregnation system, and dried in a vertical drier at temperatures from 50° to 160° C. The prepregs thus obtained are non-tacky and stable in storage at room temperature (max. 21° C. and max. 50% relative humidity). The composition of the impregnation resin solutions and the properties of the prepregs are summarized in Table 1.

Example 4

Comparative test

The procedure of examples 1 through 3 was followed, however, without adding phenoxy resin (C). The resin solution obtained was processed as in Examples 1 through 3. The composition of the impregnation resin solution and the properties of the prepregs are summarized in Table 1.

TABLE 1

Composition of the impregnation resin solutions and the properties of the prepregs

| Example # Components (MT) | 1 | 2 | 3 | 4 |
|---|---|---|---|---|
| A (P/EP resin) | 160 | 160 | 160 | 160 |
| B (Polyamine) | 33 | 33 | 33 | 33 |
| C (Phen. Resin) | 10 | 7 | 6 | — |
| D (MeIm) | 0.4 | 0.4 | 0.4 | 0.4 |
| E (MEK) | 100 | 100 | 100 | 100 |
| F (DMF) | 50 | 50 | 50 | 50 |
| g (EA) | 10 | 10 | 10 | 10 |
| Measured Values | | | | |
| Residual Content: | | | | |
| Solvent (%) | 0.1 | 0.2 | 0.2 | 0.1 |
| Residual gel time of the prepregs at 170° C. (s) | 140 | 117 | 125 | 120 |

The residual gel time is determined by applying the glass fiber-free impregnation resin (0.2 to 0.3 g) mechanically removed from the prepregs onto a heating plate preheated to 170° C. After approximately 30 s, the melted resin specimen is evenly stirred with a glass or wooden rod. The change in viscosity is observed by drawing an approximately 50 mm long string from the melt. Gelation has occurred when no more strings can be drawn. The time period (in s) measured by a stopwatch) from the time when the resin is applied onto the heating plate until the premature rupture of the string is the gel time.

Examples 5 through 8

Preparation and testing of the laminates

Prepregs prepared as in Examples 1 through 4 (glass fiber fabric type 7628, surface density 197 g/cm²) were pressed into 1.5 to 1.6 mm thick laminates consisting of eight layers of prepregs, laminated between two 35 µm Cu foils (press parameters: 175° C., 30 to 35 bar, 40 min.); subsequently the laminate was post-cured for 2 h at 190° C. The glass transition temperature $T_G$ of the laminates was determined using DMTA (dynamic-mechanical analysis); average burning time was determined according to UL 94 V, adhesion of the copper foil was determined, and the Measling test, the high-pressure cooker test, and the solder bath resistance test were performed. The values obtained are summarized in Table 2.

TABLE 2

Properties of the laminates

| Properties of the Laminates | | | | |
|---|---|---|---|---|
| Example # | 5 | 6 | 7 | 8 |
| Prepregs corresponding to Example # | 1 | 2 | 3 | 4 |
| Measured Values | | | | |
| $T_G$ (°C.) | 184 | 187 | 186 | 190 |
| Average burning time according to UL 94 V (s) | 4.6 | 4.0 | 4.1 | 3.5 |
| Classification | V-0 | V-0 | V-0 | V-0 |
| Adhesion of the Cu foil in the RT (N/mm) | 2.2 | 2.2 | 2.0 | 1.7 |
| Measling Test (LT26) | + | + | + | + |
| High-Pressure Cooker Test (s) | >20 | >20 | >20 | >20 |
| Solder Bath Resistance at 288° C. (s) | 140 | 174 | 180 | 100 |

The tests were performed on the laminates in the following manner:

Adhesion capacity of the copper lamination

A 25 mm wide and 100 mm long strip of the copper foil was removed from the glass-reinforced laminate over a length of 20 mm and torn off perpendicularly with a suitable device at a tear-off rate of 50 mm/min; the force F (N) required was measured.

Measling test

The test was performed on specimens without copper lamination (size: 20 mm×100 mm). The specimens were dipped into a 65° C. LT26 solution for 3 min. (composition: 850 ml de-ionized $H_2O$, 50 ml HCl p.a., 100 g $SnCl_2 \cdot 2H_2O$, 50 g thio-urea), rinsed with running water and subsequently placed in boiling water for 20 min. After air drying (2 to 3 min), the specimen was dipped into a 260° C. solder bath for 10 s. The laminate should not delaminate.

High-pressure cooker test

Two specimens 50 mm×50 mm were placed into a steam atmosphere at a temperature of 120° to 125° C. in a high-pressure autoclave for 2 h. Subsequently the dried specimens were placed on a 260° C. hot solder bath within 2 min. for 20 s. The specimens should not delaminate.

Solder bath resistance

The test was performed according to DIN IEC 259 using a solder bath according to section 3.7.2.3. 25 mm×100 mm specimens were dipped into a solder bath at 288° C., and the time to the appearance of delamination or bubbles was measured.

What is claimed is:

1. An epoxy resin mixture for the production of prepregs and composites, comprising:
   a phosphorus-modified epoxy resin with an epoxy value of 0.02 to 1 mol/100 g, made up of structural units derived from
   (a) polyepoxy compounds with at least two epoxy groups per molecule and (b) phosphinic acid anhydrides, phosphonic acid anhydrides, or phosphonic acid half-esters;

a glycidyl group-free compound with phenolic OH groups in the form of bisphenol-A, bisphenol-F, or a phenoxy resin obtained through the condensation of bisphenol-A or bisphenol-F with epichlorohydrin;

an aromatic polyamine of the following structure used as a hardening agent:

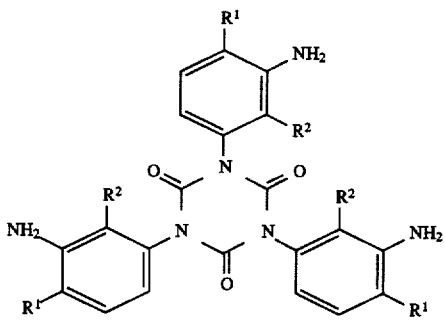

where one of the radicals $R^1$ and $R^2$ on each aromatic partial structure denotes a H atom and the other one denotes an alkyl group.

2. Epoxy resin mixture according to claim 1, wherein the phosphorus content of the epoxy resin mixture is 0.5 to 5 wt. %.

3. Epoxy resin mixture according to claim 2, wherein the phosphorus content of the epoxy resin mixture is 1 to 4 wt. %.

4. Epoxy resin mixture according to claim 1, wherein the phosphorus content of the phosphorus-modified epoxy resin is 0.5 to 13 wt. %.

5. Epoxy resin mixture according to claim 4, wherein the phosphorus content of the phosphorus-modified epoxy resin is 1 to 8 wt. %.

6. Epoxy resin mixture according to claim 1, wherein the proportion of the glycidyl group-free compound in the resin mixture is up to 20 wt. %.

7. Epoxy resin mixture according to claim 6, wherein the proportion of the glycidyl group-free compound in the resin mixture is up to 10 wt. %.

8. Epoxy resin mixture according to claim 1, wherein the ratio between epoxy function and amine hydrogen function is 1:0.5 to 1:1.1.

9. Epoxy resin mixture according to claim 8, wherein the ratio between epoxy function and amine hydrogen function is 1:0.7 to 1:0.9.

10. Epoxy resin mixture according to claim 1, wherein the hardening agent content in the resin mixture is 1 to 45 wt. %.

11. Epoxy resin mixture according to claim 10, wherein the hardening agent content in the resin mixture is 5 to 30 wt. %.

12. Epoxy resin mixture according to claim 1, wherein the hardening agent is present together with other aromatic and/or heterocyclic polyamines.

13. Epoxy resin mixture according to claim 1, wherein it contains a curing accelerator.

14. Epoxy resin mixture according to claim 13, wherein the curing accelerator is a tertiary amine or an imidazole.

15. A circuit board made of prepregs manufactured from glass fiber fabrics and the epoxy resin mixture according to claim 1.

* * * * *